United States Patent
Patra et al.

(10) Patent No.: US 9,280,055 B2
(45) Date of Patent: Mar. 8, 2016

(54) ILLUMINATION SYSTEM OF A MICROLITHOGRAPHIC PROJECTION EXPOSURE APPARATUS

(71) Applicant: Carl Zeiss SMT GmbH, Oberkochen (DE)

(72) Inventors: Michael Patra, Oberkochen (DE); Markus Deguenther, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 196 days.

(21) Appl. No.: 13/952,179

(22) Filed: Jul. 26, 2013

(65) Prior Publication Data
US 2013/0308115 A1    Nov. 21, 2013

Related U.S. Application Data

(63) Continuation of application No. PCT/EP2011/000960, filed on Feb. 28, 2011.

(51) Int. Cl.
G03F 7/20    (2006.01)

(52) U.S. Cl.
CPC ........ *G03F 7/70058* (2013.01); *G03F 7/70158* (2013.01)

(58) Field of Classification Search
CPC ............ G03F 7/70058; G03F 7/70066; G03F 7/70091; G03F 7/70108; G03F 7/70158
USPC .......................................................... 355/67
See application file for complete search history.

(56) References Cited

U.S. PATENT DOCUMENTS

| | | | | |
|---|---|---|---|---|
| 5,724,122 | A | * | 3/1998 | Oskotsky ......................... 355/67 |
| 6,078,641 | A | * | 6/2000 | Mitsui et al. ..................... 378/34 |
| 7,061,582 | B2 | | 6/2006 | Zinn et al. |
| 2004/0257547 | A1 | * | 12/2004 | Koolen et al. ................... 355/53 |

(Continued)

FOREIGN PATENT DOCUMENTS

| | | |
|---|---|---|
| EP | 1 262 836 | 12/2002 |
| EP | 1 564 593 | 8/2005 |

(Continued)

OTHER PUBLICATIONS

International Search Report for corresponding Appl No. PCT/EP2011/000960, dated Jan. 30, 2012.

(Continued)

*Primary Examiner* — Peter B Kim
*Assistant Examiner* — Michelle Iacoletti
(74) *Attorney, Agent, or Firm* — Fish & Richardson P.C.

(57) ABSTRACT

An illumination system of a microlithographic projection exposure apparatus comprises a light source which is configured to produce projection light (PL), a pupil plane and a diffractive optical element that is arranged between the light source and the pupil plane such that an irradiance distribution of projection light (PL) in the pupil plane depends on the position of a field that is illuminated by the projection light (PL) on the diffractive optical element. The illumination system further comprises an optical imaging system that is arranged between the light source and the diffractive optical element. The optical imaging system ensures that changes of the direction and divergence of the projection light (PL) emitted by the light source have no substantial effect on the position and size of the field which is illuminated on the diffractive optical element by the projection light (PL).

21 Claims, 6 Drawing Sheets

(56) References Cited

U.S. PATENT DOCUMENTS

| | | | |
|---|---|---|---|
| 2005/0035103 A1 | 2/2005 | Partlo et al. | |
| 2006/0087634 A1 | 4/2006 | Brown et al. | |
| 2006/0102604 A1 | 5/2006 | Dane et al. | |
| 2007/0024836 A1 | 2/2007 | Singer et al. | |
| 2007/0160096 A1 | 7/2007 | Tanaka | |
| 2008/0192359 A1* | 8/2008 | Sohmer et al. | 359/649 |
| 2008/0259450 A1 | 10/2008 | Suda | |
| 2012/0249988 A1* | 10/2012 | Runde et al. | 355/67 |

FOREIGN PATENT DOCUMENTS

| | | |
|---|---|---|
| JP | H01-96929 | 4/1989 |
| JP | 2005-150541 | 6/2005 |
| JP | 2005-183736 | 7/2005 |
| JP | 2005-228846 | 8/2005 |
| JP | 2008-270571 | 11/2008 |
| JP | 2009-033047 | 2/2009 |
| JP | 2013-501348 | 1/2013 |
| JP | 2013-522918 | 6/2013 |
| WO | WO02/095811 | 11/2002 |
| WO | WO 2005/026843 | 3/2005 |
| WO | WO 2010/006687 | 1/2010 |
| WO | WO 2011/012148 | 2/2011 |

OTHER PUBLICATIONS

E. Delano, "First-order Design and the $y, \bar{y}$ Diagram", Applied Optics, vol. 2, No. 12, pp. 1251-1256, Dec. 1963.

Japanese Office Action with translation thereof for JP Appln. No. 2013-555762, dated Nov. 20, 2014.

* cited by examiner

ILLUMINATION SYSTEM OF A MICROLITHOGRAPHIC PROJECTION EXPOSURE APPARATUS

FIELD OF THE INVENTION

The invention generally relates to illumination systems for illuminating a mask in microlithographic exposure apparatus, and in particular to such systems in which a diffractive optical element having position dependent diffractive effects is used to define an irradiance distribution in a pupil plane.

DESCRIPTION OF RELATED ART

Microlithography (also called photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) or vacuum ultraviolet (VUV) light. Next, the wafer with the photoresist on top is exposed to projection light in a projection exposure apparatus. The apparatus projects a mask containing a pattern onto the photoresist so that the latter is only exposed at certain locations which are determined by the mask pattern. After the exposure the photoresist is developed to produce an image corresponding to the mask pattern. Then an etch process transfers the pattern into the thin film stacks on the wafer. Finally, the photoresist is removed. Repetition of this process with different masks results in a multi-layered microstructured component.

A projection exposure apparatus typically includes an illumination system for illuminating the mask, a mask stage for aligning the mask, a projection objective and a wafer alignment stage for aligning the wafer coated with the photoresist. The illumination system illuminates a field on the mask that may have the shape of a rectangular or curved slit, for example.

In current projection exposure apparatus a distinction can be made between two different types of apparatus. In one type each target portion on the wafer is illuminated by exposing the entire mask pattern onto the target portion in one go. Such an apparatus is commonly referred to as a wafer stepper. In the other type of apparatus, which is commonly referred to as a step-and-scan apparatus or scanner, each target portion is illuminated by progressively scanning the mask pattern under the projection beam along a scan direction while synchronously moving the substrate parallel or anti-parallel to this direction.

As the technology for manufacturing microstructured devices advances, there are ever increasing demands also on the illumination system. Ideally, the illumination system illuminates each point of the illuminated field on the mask with projection light having a well defined spatial and angular irradiance distribution. The term angular irradiance distribution describes how the total light energy of a light bundle, which converges towards a particular point in the mask plane, is distributed among the various directions of the rays that constitute the light bundle.

The angular irradiance distribution of the projection light impinging on the mask is usually adapted to the kind of pattern to be projected onto the photoresist. For example, relatively large sized features may require a different angular irradiance distribution than small sized features. The most commonly used angular irradiance distributions of projection light are referred to as conventional, annular, dipole and quadrupole illumination settings. These terms refer to the spatial irradiance distribution in a pupil plane of the illumination system. With an annular illumination setting, for example, only an annular region is illuminated in the pupil plane. Thus there is only a small range of angles present in the angular irradiance distribution of the projection light, which means that all light rays impinge obliquely with similar aperture angles onto the mask.

Different approaches are known in the art to modify the angular irradiance distribution of the projection light in the mask plane so as to achieve the desired illumination setting. In the simplest case a stop (diaphragm) comprising one or more apertures is positioned in a pupil plane of the illumination system. Since locations in a pupil plane translate into angles in the mask plane or another Fourier related field plane, the size, shape and location of the aperture(s) in the pupil plane determines the angular irradiance distribution in the mask plane. However, any change of the illumination setting requires a replacement of the stop. This makes it difficult to finely adjust the illumination setting, because this would require a very large number of stops that have aperture(s) with slightly different sizes, shapes or locations. Furthermore, the use of stops inevitably results in light losses and thus reduces the throughput of the apparatus.

Light losses caused by stops are avoided if diffractive optical elements are used to produce a specific irradiance distribution in the pupil plane of the illumination system. The irradiance distribution can be modified, at least to a certain extent, by adjustable optical elements such as zoom lenses or a pair of axicon elements that are arranged between the diffractive optical element and the pupil plane.

The greatest flexibility in producing different irradiance distributions in the pupil plane is obtained when mirror arrays are used instead of the diffractive optical elements. For example, EP 1 262 836 A1 proposes the use of a mirror array that is realized as a micro-electromechanical system (MEMS) comprising more than 1000 microscopic mirrors. Each of the mirrors can be tilted in two different planes perpendicular to each other. Thus radiation incident on such a mirror device can be reflected into (substantially) any desired direction of a hemisphere. A condenser lens arranged between the mirror array and the pupil plane translates the reflection angles produced by the mirrors into locations in the pupil plane. This prior art illumination system makes it possible to illuminate the pupil plane with a plurality of spots, wherein each spot is associated with one particular microscopic mirror and is freely movable across the pupil plane by tilting this mirror.

Similar illumination systems are known from US 2006/0087634 A1, U.S. Pat. No. 7,061,582 B2, WO 2005/026843 A2 and WO 2010/006687.

However, the use of mirror arrays is technologically demanding and requires sophisticated optical, mechanical and computational solutions.

A simpler approach to produce continuously variable spatial irradiance distributions in the pupil plane is the use of diffractive optical elements having position dependent diffractive effects. Depending on the position where the projection light impinges on the element, different spatial irradiance distributions are produced in the pupil plane. Usually the projection light beam will be kept fixed and the diffractive optical element is displaced with the help of a displacement mechanism so as to change the position where the projection light beam impinges on the element. Diffractive optical elements of this kind are commercially available, for example, from *Tessera Technologies, Inc.*, San Jose, USA.

However, if the diffractive effects produced by the diffractive optical element depend on the position where the projection light impinges on the element, it is mandatory that the position, once it has been set (for example by displacing the diffractive optical element), does not change any more. If the position of the light field on the diffractive optical element is not stable, but is allowed to slightly vary in the short or long term, the diffractive effect produced by the diffractive optical element will vary, too. This, in turn, will lead to undesired variations of the angular irradiance distribution of the projection light when it impinges on the mask. Since the imaging of the mask depends very sensitively on the angular irradiance distribution, variations of the light field position on the diffractive optical element may ultimately have the effect that one and the same structures of the mask will be imaged with different imaging quality on the light sensitive layer.

The stabilization of the position of the light field on the diffractive optical element is an issue because the light source, which is usually realized as a laser, is often spaced apart from the remaining components of the illumination system by a distance of a few meters up to about 25 meters. The projection light beam produced by the light source is usually guided in a tube or another kind of enclosure and is directed from the light source to the remaining portion of the illumination system using planar folding mirrors. The total length and configuration of this portion of the illumination system, which is usually referred to as beam delivery, often depends on the local conditions prevailing in the semiconductor fabrication plant. For that reason one should be able to adapt the length and the configuration of the beam delivery to these local conditions.

Due to the significant length of the beam delivery, minute changes (for example less than 0.1 mrad) of the direction of the projection light beam emitted by the laser light source will shift the light field illuminated on the diffractive optical element by several millimeters. Furthermore, the divergence of the projection light emitted by the laser light source is also subject to alterations on a daily scale (particular after gas injects), but also on a longer time scale as a result of ageing effects. Also changes of the divergence will affect the position and size of the light field that is illuminated on the diffractive optical element, and thus ultimately the imaging quality of the projection exposure apparatus.

US 2007/0160096 A1 discloses an apparatus for laser annealing semiconductor films during the manufacture of thin film transistors. An optical imaging system is arranged between a laser light source and a beam expander.

Reference is also made to US 2006/0102604 A1 and US 2005/0035103 A1 relating to laser peening and laser annealing apparatus, respectively.

SUMMARY OF THE INVENTION

It is an object of the present invention to provide an illumination system of a microlithographic projection exposure apparatus which makes it possible to continuously and flexibly change the angular irradiance distribution at mask level using a diffractive optical element having position dependent diffractive effects, while it is ensured that the angular irradiance distribution is stable once it has been defined by an operator of the apparatus.

In accordance with the present invention this object is achieved by an illumination system of a microlithographic projection exposure apparatus comprising a light source which is configured to produce projection light, a pupil plane and a diffractive optical element. The latter is arranged between the light source and the pupil plane such that an irradiance distribution of projection light in the pupil plane depends on the position of a field that is illuminated by the projection light on the diffractive optical element. The illumination system further comprises an optical imaging system that is arranged between the light source and the diffractive optical element.

The optical imaging system has the effect that the diffractive optical element is in fact illuminated by an image of the light source. Since the distance between this image and the diffractive optical element is small or even zero, changes of the direction and divergence of the projection light beam emitted by the light source have no or at least no significant effect on the position of the field which is illuminated on the diffractive optical element by the projection light.

If a light exit window of the light source is arranged in the object plane and the diffractive optical element is arranged in the image plane of the optical imaging system, the light exit window of the light source will be precisely imaged on the diffractive optical element. As a result, changes of the direction and the divergence of the projection light will have no effect at all on the position of the field which is illuminated on the diffractive optical element by the projection light.

However, often it will be desirable that the diffractive optical element is arranged in a slightly defocused axial position in order to achieve a more homogenous irradiance distribution within the field that is illuminated on the diffractive optical element by the projection light. The defocusing may be achieved by either arranging the diffractive optical element outside the image plane of the optical imaging system, by arranging the light exit window of the light source outside the object plane of the optical imaging system, or by arranging both components outside the image and object plane, respectively.

Often it is preferred to have an optical imaging system which is telecentric on its object and also on its image side. If one adds as additional constraint that the optical imaging system shall contain no optical elements that have a refractive or a reflective power and are arranged inside the beam delivery, it turns out that the optical imaging system should at least comprise three optical elements having a refractive or a reflective power. With less than three optical elements it is not possible to achieve telecentricity and to avoid the arrangement of such optical elements in the beam delivery.

For example, the optical imaging system may comprise two positive lenses and a negative lens that is arranged between the two positive lenses. Such an optical imaging system requires only a small additional volume and can be arranged between the light source and the beam delivery without a need to substantially modify the remaining components, in particular the beam delivery, of the illumination system.

As it has been mentioned above, the total length of the beam delivery often depends on the local conditions in the semiconductor fabrication plant. Thus the optical imaging system should be configured such that it can be quickly and simply adapted to different lengths of the beam delivery. If the optical imaging system is telecentric on its object and on its image side, it is necessarily afocal. Then the free image distance can be varied by changing the free object distance such that the telecentricity is maintained.

In order to be able to vary the object length of the optical imaging system in a simple manner, the illumination may comprise a multiple beam folding system that is arranged between the light source and the optical imaging system. Such a multiple beam folding system may comprise a plurality of prisms or planar mirrors, for example, and may be configured such that the optical path length within the multiple beam folding system can be simply adjusted by displacing one or more of the prisms or planar mirrors. For example, at least one prism or mirror may be mounted on a guide rail such that it can be fixed at different positions along the guide rail.

In some embodiments the axial distance between the light source and the diffractive optical element is between 2 m and 25 m, and in particular between 5 m and 20 m.

The optical imaging system may have a transverse magnification $\beta$ with $|\beta|>1$, and preferably With $|\beta|\geq 2$. Since an increase of the free image distance by $\Delta d_i$ will require an increase $\Delta d_o = \Delta d_i/\beta^2$ of the free object distance, the condition $|\beta|>1$ ensures that the increase $\Delta d_o$ of the free object distance will always be smaller than the increase $\Delta d_i$ of the free image distance. The higher $|\beta|$ is, the smaller will be the adjustments of the free object distance if a certain free image distance, which practically corresponds to the length of the beam delivery, shall be obtained.

A transverse magnification $\beta$ with $|\beta|>1$ further ensures that the free object distance will be smaller than the free image distance. This is advantageous, because then all optical elements contained in the optical imaging system can be arranged between the light source and the beam delivery of the illumination system.

Last but not least a transverse magnification $\beta$ with $|\beta|>1$ has the effect that the field illuminated on the diffractive optical element is larger than the cross section of a beam of projection light when it is emitted by the light source, as it is usually desired.

However, if the transverse magnification is very large, the size of the field which is illuminated on the diffractive optical element may eventually be too large. Then an additional beam shrinking unit may be arranged between the optical imaging system and the diffractive optical element. This unit is configured to reduce the diameter of the collimated light beam emerging from the optical imaging system.

The illumination system may comprise a displacement mechanism that is configured to displace the diffractive optical element along a displacement direction which is not parallel to the optical axis. Then the diffractive effect produced by the diffractive optical element may be varied, depending on the position of the light field, by displacing the diffractive optical element along the displacement direction.

Instead of displacing the diffractive optical element relative to the projection light, it may also be considered to move a beam of projection light relative to the fixed diffractive optical element, or even to combine both measures. For moving the projection light beam a beam steering device may be used is configured to change the position of the light field if the diffractive optical element is momentarily stationary.

DEFINITIONS

The term "light" is used herein to denote any electromagnetic radiation, in particular visible light, UV, DUV and VUV light.

The term "light ray" is used herein to denote light whose path of propagation can be described by a line.

The term "light bundle" is used herein to denote a plurality of light rays that have a common origin in a field plane.

The term "light beam" is used herein to denote the light that passes through a particular lens or another optical element.

The term "position" is used herein to denote the location of a reference point of a body or an immaterial object (such as light) in the three-dimensional space. The position is usually indicated by a set of three Cartesian coordinates. The orientation and the position therefore fully describe the placement of a body in the three-dimensional space.

The term "direction" is used herein to denote the spatial orientation of a straight line. A movement of an object along a specific direction thus implies that the object is allowed to move in two opposite senses on that line.

The term "surface" is used herein to denote any plane or curved surface in the three-dimensional space. The surface may be part of a body or may be completely detached therefrom, as it is usually the case with a field or a pupil plane.

The term "field plane" is used herein to denote a plane that is optically conjugate to the mask plane.

The term "conjugated plane" is used herein to denote planes between which an imaging relationship is established. More information relating to the concept of conjugate planes are described in an essay E. Delano entitled: "First-order Design and the y, $\bar{y}$ Diagram", Applied Optics, 1963, vol. 2, no. 12, pages 1251-1256.

The term "pupil plane" is used herein to denote a plane in which marginal rays passing through different points in the mask plane intersect. The term "pupil plane" is also used if one refers not to a plane in the mathematical sense, but to a slightly curved surface so that, in the strict sense, it should be referred to as pupil surface.

The term "optical raster element" is used herein to denote any optical element, for example a lens, a prism or a diffractive optical element, which is arranged, together with other identical or similar optical raster elements, so that each optical raster element is associated with one of a plurality of adjacent optical channels.

The term "telecentric" is used herein to denote the fact that principal rays of light bundles emerging from a field plane propagate parallel to an optical axis.

The term "optical integrator" is used herein to denote an optical system that increases the product NA·$\alpha$, wherein NA is the numerical aperture and $\alpha$ is the area which is illuminated in a field plane.

The term "condenser" is used herein to denote an optical element or an optical system that establishes (at least approximately) a Fourier relationship between two planes, for example a field plane and a pupil plane.

The term "free object distance" is used herein to denote the axial distance between the vertex of the first object side optical element of an optical imaging system and the object plane.

The term "free image distance" is used herein to denote the axial distance between the vertex of the last image side optical element of an optical imaging system and the image plane.

The term "spatial irradiance distribution" is used herein to denote how the total irradiance varies over a real or imaginary surface on which light impinges. Usually the spatial irradiance distribution can be described by a function $I_s(x, y)$, with x, y being spatial coordinates of a point on the surface.

The term "angular irradiance distribution" is used herein to denote how the irradiance of a light bundle varies depending on the angles of the light rays that constitute the light bundle. Usually the angular irradiance distribution can be described by a function $I_a(\alpha, \beta)$, with $\alpha$, $\beta$ being angular coordinates describing the directions of the light rays.

BRIEF DESCRIPTION OF THE DRAWINGS

Various features and advantages of the present invention may be more readily understood with reference to the following detailed description taken in conjunction with the accompanying drawings in which.

DESCRIPTION OF PREFERRED EMBODIMENTS

I. General Construction of Projection Exposure Apparatus

Figure 1:
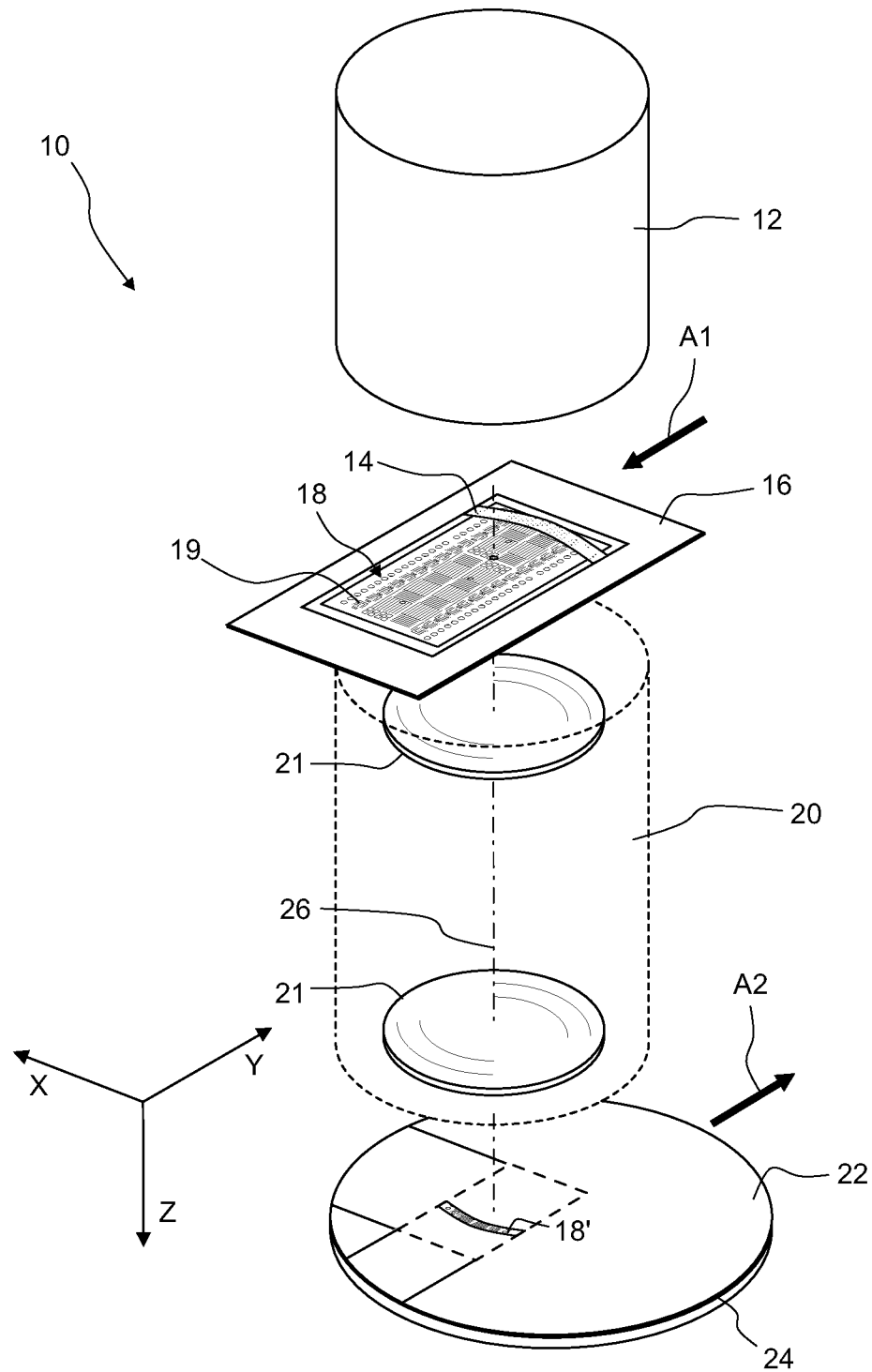
FIG. 1 is a schematic perspective view of a projection exposure apparatus in accordance with the present invention.

FIG. 1 is a perspective and highly simplified view of a projection exposure apparatus 10 in accordance with the present invention. The apparatus 10 comprises an illumination system 12 which produces a projection light beam (not shown). The latter illuminates a field 14 on a mask 16 containing a pattern 18 formed by a plurality of small features 19 that are schematically indicated in FIG. 1 as thin lines. In this embodiment the illuminated field 14 has the shape of a ring segment. However, other shapes of the illuminated field 14, for example rectangles, are contemplated as well.

A projection objective 20 images the pattern 18 within the illuminated field 14 onto a light sensitive layer 22, for example a photoresist, which is supported by a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned via a mask stage (not shown) in an object plane of the projection objective 20. Since the latter has a transverse magnification M with |M|<1, a minified image 18' of the pattern 18 within the illuminated field 14 is projected onto the light sensitive layer 22.

In this embodiment the design of the projection objective 20 requires that the illuminated field 14 is positioned off the optical axis 26 of the projection objective 20. With other types of projection objectives, the illuminated field 14 may be centered on the optical axis 26.

During the projection the mask 16 and the substrate 24 move along a scan direction which corresponds to the Y direction indicated in FIG. 1. The illuminated field 14 then scans over the mask 16 so that patterned areas larger than the illuminated field 14 can be continuously imaged. The ratio between the velocities of the substrate 24 and the mask 16 is equal to the transverse magnification M of the projection objective 20. If the projection objective 20 inverts the image (M<0), the mask 16 and the substrate 24 move in opposite senses, as this is indicated in FIG. 1 by arrows A1 and A2. However, the present invention may also be used in stepper tools in which the mask 16 and the substrate 24 do not move during projection of the mask.

II. General Construction of Illumination System

Figure 2:
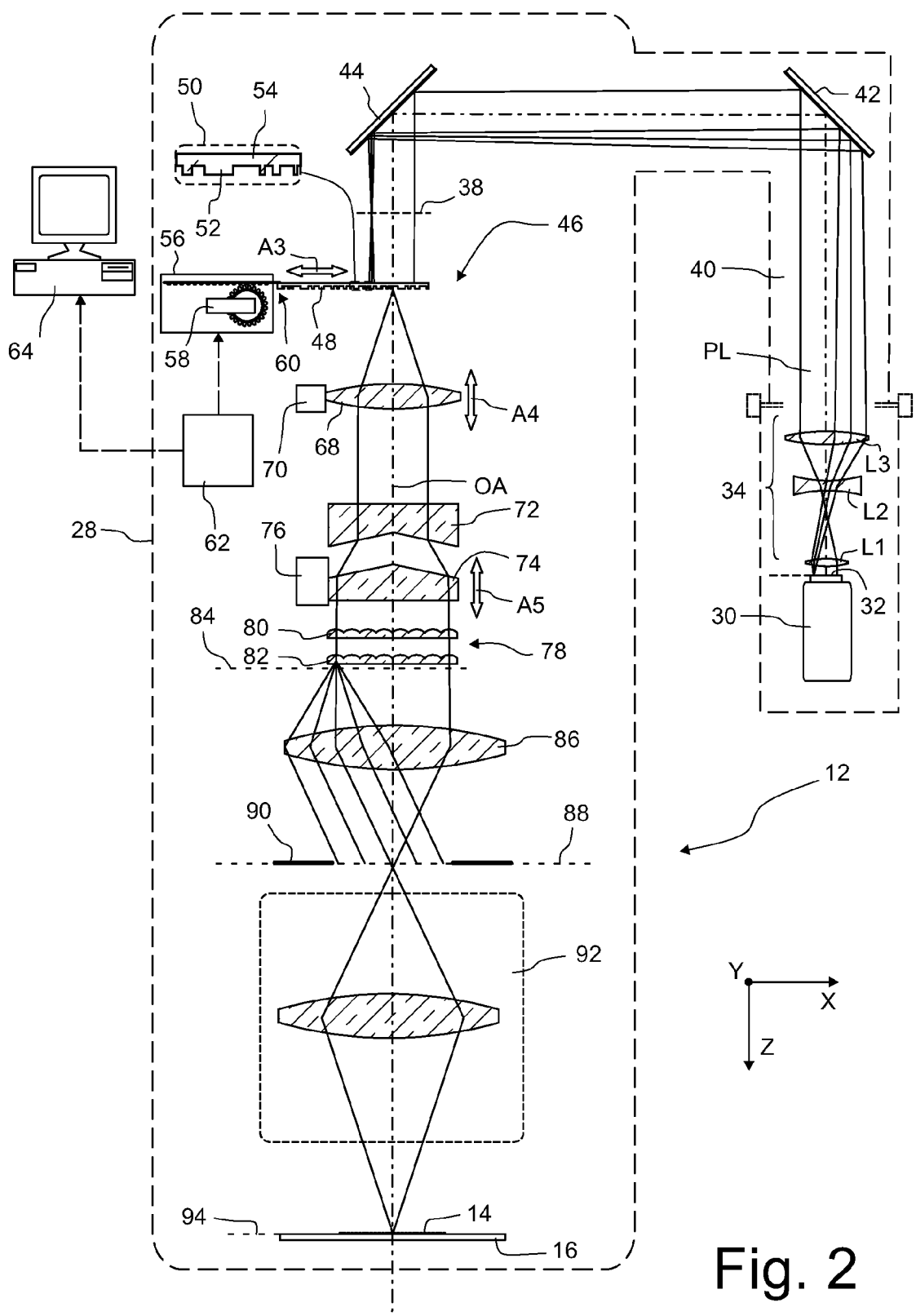
FIG. 2 is a meridional section through an illumination system of the apparatus shown in FIG. 1 according to a first embodiment.

FIG. 2 is a meridional section through the illumination system 12 shown in FIG. 1. For the sake of clarity, the illustration of FIG. 2 is considerably simplified and not to scale. This particularly implies that different optical units are represented by one or very few optical elements only. In reality, these units may comprise significantly more lenses and other optical elements.

The illumination system 12 includes a housing 28 and a light source 30 that is, in the embodiment shown, realized as an excimer laser having a light exit window 32. The light source 30 emits projection light PL having a wavelength of about 193 nm (VUV). Other types of light sources 30 and other wavelengths, for example 248 nm (DUV) or 157 nm, are also contemplated.

In the embodiment shown, the projection light PL leaves the light exit window 32 and enters an optical imaging system 34 comprising three lenses L1, L2 and L3. The optical imaging system 34 has an object plane 36, in which the light exit window 32 of the light source 30 is arranged, and an image plane 38.

The projection light PL emerging from the optical imaging system 34 passes through a beam delivery 40 in which a first planar beam path folding mirror 42 and a second planar beam path folding mirror 44 are arranged. The total length of the beam delivery 40 may be in a range between 2 m and 25 m. The projection light PL then enters a pupil defining unit 46 that is used to produce variable spatial irradiance distributions in a subsequent pupil plane. To this end the pupil defining unit 46 comprises a diffractive optical element 48 extending in a plane that is substantially orthogonal to an optical axis OA of the illumination system 12.

As can best be seen in the enlarged cut-out 50, the diffractive optical element 48 comprises a plurality of minute diffractive structures 52 that are formed on a planar substrate 54. The diffractive optical element 48 may be realized as a computer generated hologram (CGH), as it is known in the art as such. The optical properties of the diffractive optical element 48 will be explained further below with reference to FIG. 3.

The pupil defining unit 46 further includes a displacement mechanism 56 that is configured to displace the diffractive optical element 48 along the X direction (see double arrow A3). To this end the displacement mechanism 56 comprises a servo motor 58 which is coupled to the diffractive optical element 48 by a toothed gearing 60. The servo motor 58 is controlled by a control unit 62 which is connected to an overall system control 64.

The pupil defining unit 46 further comprises a zoom collimator lens 68, which can be displaced along the optical axis OA with the help of a first actuator 70 (see double arrow A4), and a first and a second axicon element 72, 74 having complementary conical surfaces. The distance between the axicon elements 72, 74 along the optical axis OA can be changed with the help of a second actuator 76, as it is indicated by a double arrow A5. In this embodiment the second actuator 76 is coupled only to the second axicon element 74; other configurations to change the distance between the two axicon elements 72, 74 are also feasible. The axicon elements 72, 74 have the effect that an irradiance distribution at the entrance surface of the first axicon element 72 is radially shifted outwardly. The amount of radial shift depends on the distance between the first axicon element 72 and the second axicon element 74.

Light having passed the axicon elements 72, 74 impinges on an optical integrator 78 which comprises, in the embodiment shown, two arrays 80, 82 of optical raster elements. Each optical raster element is formed by crossing two cylindrical lenses, as it is known in the art as such. The optical raster elements may also be formed by rotationally symmetric lenses having a rectangular borderline, for example. The optical integrator 78 produces in a pupil plane 84 a plurality of secondary light sources. Each secondary light source is associated with an optical channel which is defined by two optical raster elements of the arrays 80, 82 having the same X and Y coordinates.

A condenser 86 transforms the angular light distribution produced by the secondary light sources into a spatial irradiance distribution at a subsequent intermediate field plane 88. Since all secondary light sources produce substantially the same angular irradiance distribution, also the spatial irradiance distributions in the intermediate field plane 88 are very similar. The superposition of these irradiance distributions results in a very homogenous illumination of a field in the intermediate field plane 88.

The intermediate field plane 88 is imaged, together with a field stop 90, by a field stop objective 92 onto a mask plane 94 in which the mask 16 is arranged. The field 14 illuminated on the mask 16 is thus an image of the field which is illuminated in the intermediate field plane 88 by the plurality of secondary light sources and which is masked by the field stop 90.

III. Optical Properties of Diffractive Optical Element

In the following the optical properties of the diffractive optical element 48 will be explained in more detail with reference to FIG. 3.

Figure 3:
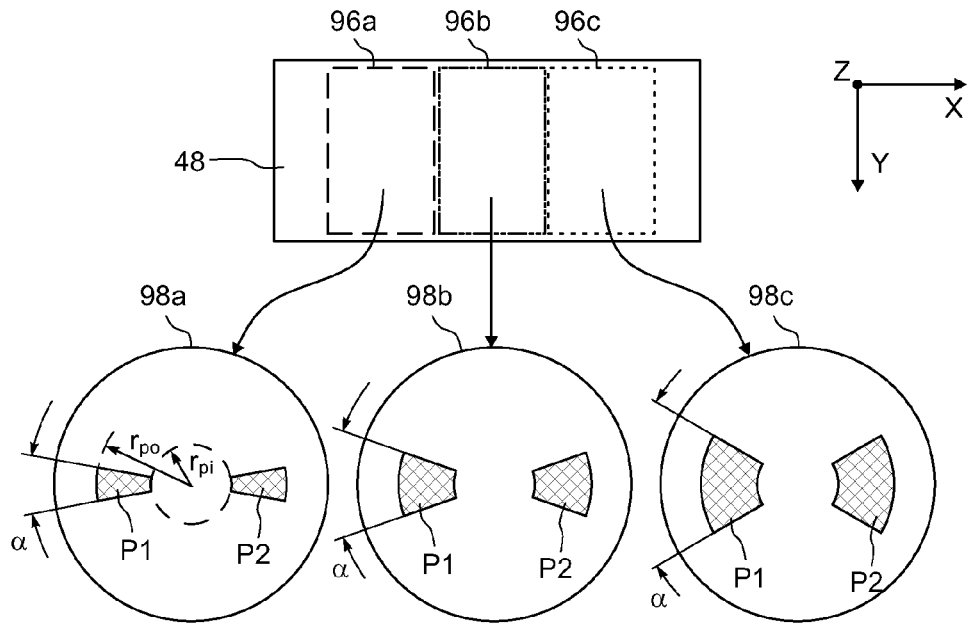
FIG. 3 shows in its upper portion a top view of a diffractive optical element contained in the illumination system shown in FIG. 2 and in its lower portion three irradiance distributions that are produced in the far field by the diffractive optical element if a field is illuminated on the latter at different positions.

FIG. 3 shows in its upper portion a top view of the diffractive optical element 48. The diffractive structures 52 of the diffractive optical element 48, which are not shown in FIG. 3 for the sake of simplicity, are designed such that the diffractive effect produced by the diffractive optical element 48 depends on the position of a light field that is illuminated by the projection light PL on the diffractive optical element 48.

In FIG. 3 a first, a second and a third position of such a light field are shown and denoted by 96a, 96b and 96c, respectively. The three positions 96a, 96b, 96c differ from one another only with respect to their location along the X direction.

If the projection light PL illuminates a field at the first position 96a on the first diffractive optical element 42, the latter is assumed to produce in this embodiment an angular light distribution which corresponds in the far field (or after Fourier transformation by the zoom collimator lens 68, which is equivalent) to a first spatial irradiance distribution which is denoted in FIG. 3 by 98a. In this first spatial irradiance distribution 98a only two small poles P1, P2 are illuminated that are spaced apart along the X direction. Each pole P1, P2 has the shape of a segment of a ring having an outer radius $r_{po}$ and an inner radius $r_{pi}$. The angular extension of the ring segment, which will be referred to in the following as pole width angle $\alpha$, is identical for both poles P1, P2.

If the projection light PL illuminates a field at the second position 96b on the first diffractive optical element 42, a similar spatial irradiance distribution will be produced in the far field, but with poles P1, P2 having a larger pole width angle $\alpha$. In the third position 96c of the light field the pole width angle $\alpha$ has its maximum value.

It is to be understood that in all intermediate positions of the light field similar poles P1, P2 will be produced, but with pole width angles $\alpha$ having values which are between those that are indicated in FIG. 3 for the three positions 96a, 96b and 96c.

In this embodiment the different positions 96a, 96b, 96c illustrated in FIG. 3 are not produced by moving the projection light PL over the fixed diffractive optical element 42, but by displacing, with the help of the displacement mechanism 56, the diffractive optical element 48 relative to the fixed beam of projection light PL.

IV. Function

The optical imaging system 34 images the light exit window 32 of the light source 30 on the image plane 38 which is arranged at short distance in front of the diffractive optical element 48. The slightly defocused arrangement of the diffractive optical element 48 with respect to the image plane 38 results in a more homogenous irradiance distribution on the diffractive optical element 48.

The diffractive optical element 48 is therefore in fact illuminated by an image of the light exit window 32 of the light source 30. Since the distance between this image and the diffractive optical element 48 is small, changes of the direction and divergence of the projection light emitted at the light exit window 32 of the light source 30 have no, or at least no substantial, effect on the position of the field which is illuminated on the diffractive optical element 48 by the projection light PL. This would be different in the absence of the optical imaging system 34, because then small changes of the direction and divergence of the projection light beam emerging from the light exit window 32 would be considerably "amplified" by the long beam delivery 40, and thus the position and size of the field illuminated on the diffractive optical element 48 would vary by a few millimeters or even centimeters.

By providing the optical imaging system 34, the position of the field illuminated on the diffractive optical element 48 is exclusively determined by the displacement mechanism 56. By using precision mechanics it is possible to set this position with an accuracy which is well below 1 mm. In this way the position of the illuminated field on the diffractive optical element 48, and thus the irradiance distribution in the pupil plane 84, can be precisely set and kept constant irrespective of the operating conditions and short or long term drift effects occurring in the light source 30.

The irradiance distribution in the pupil plane 84 may be further varied by changing the axial positions of the zoom-collimator lens 68 and the axicon element 74 with the help of the actuators 70, 76.

V. Alternative Embodiments of Optical Imaging System

In the following various alternative embodiments of the optical imaging system 34 will be described with reference to FIGS. 4 to 11.

Figure 4:
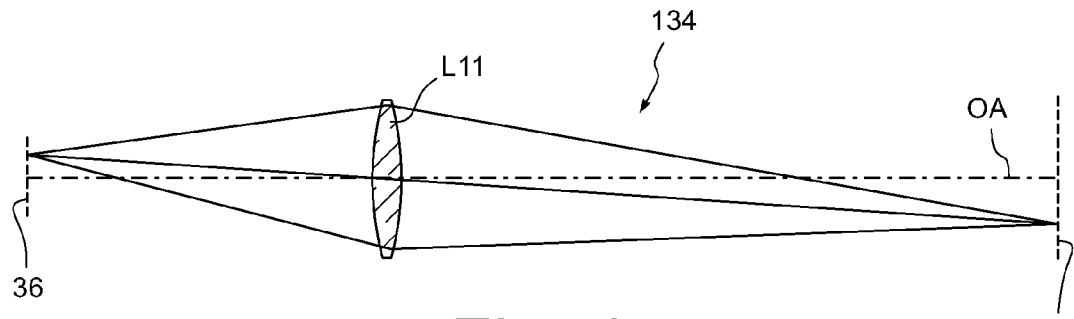
FIG. 4 is a meridional section through an embodiment of an optical imaging system that may be used in the illumination system shown in FIG. 2, wherein the optical imaging system comprises only a single positive lens.

FIG. 4 is a meridional section through an optical imaging system 134, which comprises only a single positive lens L11. Although also the optical imaging system 134 ensures a stable position of the field that is illuminated on the diffractive optical element 48, it has the drawback that the lens L11 has to be arranged within the beam delivery 40, which is usually not desirable for various reasons. Furthermore, the optical imaging system 134 is neither telecentric on its object nor on its image side. Telecentricity is often mandatory, because otherwise the diffractive optical element 48 may not produce the desired far field spatial irradiance distribution.

Figure 5:
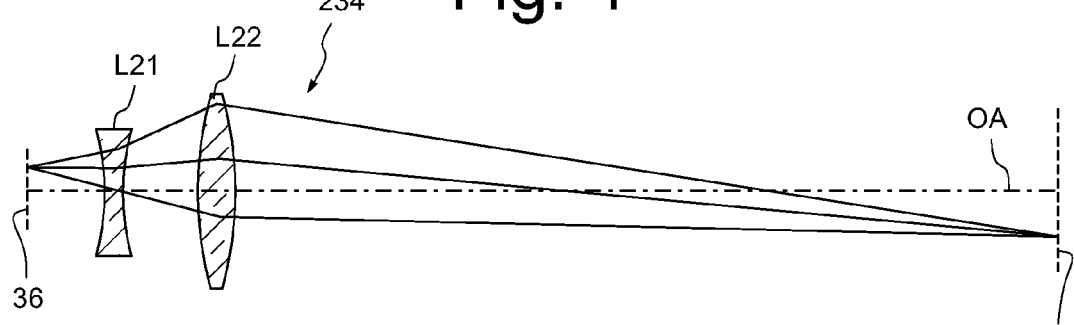
FIG. 5 is a meridional section through an embodiment of an optical imaging system that may be used in the illumination system shown in FIG. 2, wherein the optical imaging system comprises two lenses which can be arranged outside the beam delivery.

FIG. 5 is a meridional section through an optical imaging system 234 comprising two lenses L21, L22 which are arranged so close to the object plane 36 that they do not have to be mounted arranged within the beam delivery 40. However, the optical imaging system 234 still does not have the desired telecentricity.

Figure 6:
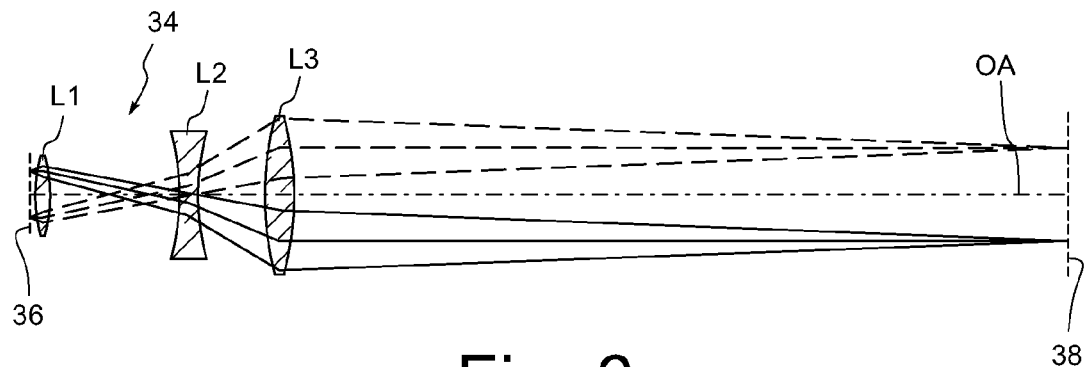
FIG. 6 is a meridional section through the optical imaging system shown in FIG. 2.

FIG. 6 is a meridional and enlarged section through the optical imaging system 34 shown in FIG. 2. The lens L1, which is arranged immediately behind the object plane 36, ensures that the light bundles emerging from the object plane 36 are tilted towards the optical axis. This makes it possible to achieve the desired telecentricity, i.e. the optical imaging system 34 is telecentric both on the object and the image side.

In the optical imaging system 34 shown in FIG. 6 the projection light PL is concentrated on a relatively small area on the negative lens L2. If this shall be avoided, for example because there is risk of material degradations in the lens L2, a modified arrangement of three lenses L31, L32, L33 may be used, as it is shown in the meridional section of FIG. 7 for an alternative optical imaging system 334. Here the distances and the refractive powers of the lenses L31, L32, L33 are modified in such a way that the area irradiated on the negative lens L32 is larger.

Figure 7:
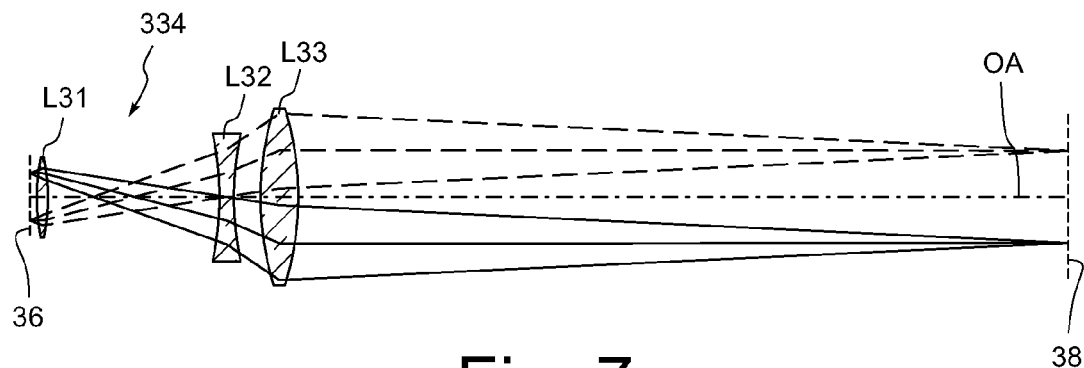
FIG. 7 is a meridional section through a further embodiment of an optical imaging system that may be used in the illumination system shown in FIG. 2, wherein a broader irradiance distribution is produced on the second lens.
Figure 8:
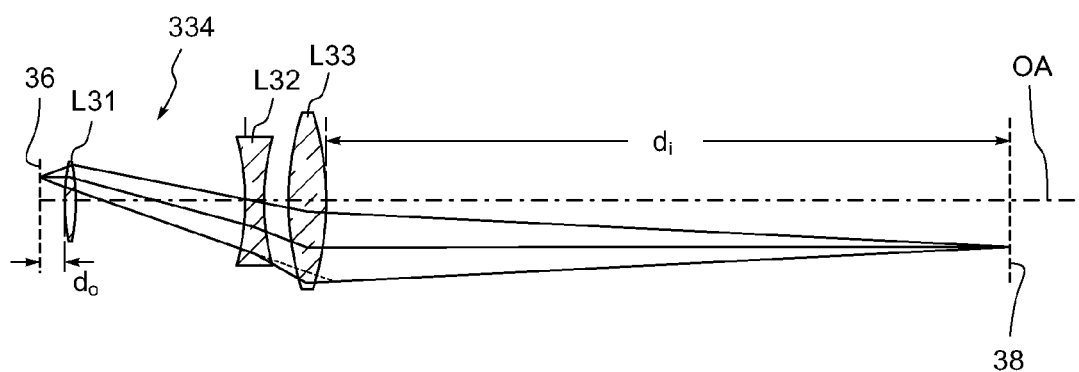
FIG. 8 is a meridional section through the imaging system shown in FIG. 7, but with modified free object and image distances.

The telecentric optical imaging systems 34 and 334 shown in FIGS. 6 and 7 make it possible, without compromising the telecentricity, to vary the free image distance $d_i$ between the last lens L3 or L33, respectively, and the image plane 38 by varying the free object distance $d_o$ between the object plane 36 and the first lens L1 or L31, respectively. This is illustrated in FIG. 8 which is a meridional section through the optical imaging system 334 shown in FIG. 7, but with a free object distance $d_o$ which is increased by $\Delta d_o$ compared to the arrangement shown in FIG. 7. This results in a free image distance $d_i$ which is decreased by $\Delta d_i$ compared to the arrangement shown in FIG. 7. If the optical imaging system has a transverse magnification $\beta$, the relationship between $\Delta d_i$ and $\Delta d_o$ is given by $\Delta d_i = \beta^2 \cdot \Delta d_o$. Thus the larger the transverse magnification $\beta$ of the optical imaging system 334 is, the smaller are the adjustments of the free object distance $d_o$ that are necessary to obtain a certain change $\Delta d_i$ of the free image distance.

A demand for such changes often arises if the light source 30 is arranged at a significant distance away from the remaining components of the illumination system 12. Then it is necessary to be able to adjust the total length of the beam delivery 40, which corresponds to the free image distance $d_i$ indicated in FIG. 8, to the particular requirements at the location where the projection exposure apparatus 10 shall be installed. In principle a variable free image distance $d_i$ could be obtained using a zoom optical imaging system, but this increases the complexity of the optical imaging system considerably.

Figure 9:
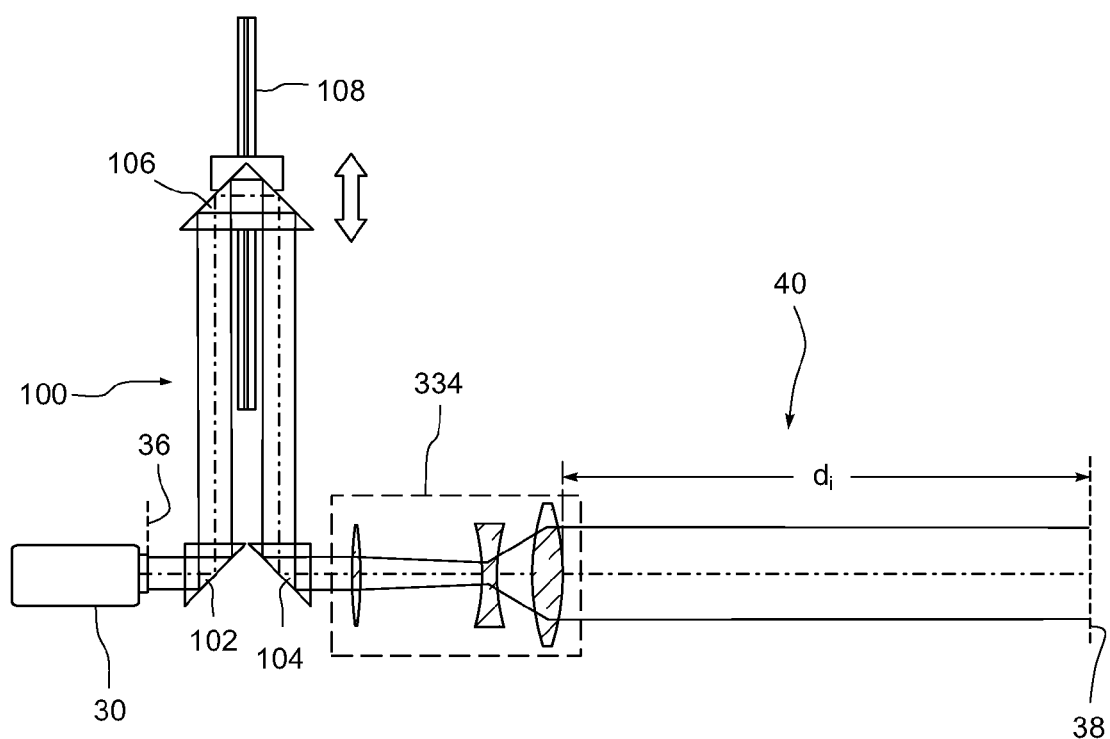
FIG. 9 illustrates a portion of the illumination system shown in FIG. 2 according to an alternative embodiment in which a multiple beam folding system is arranged between the light source and the optical imaging system.
Figure 10:
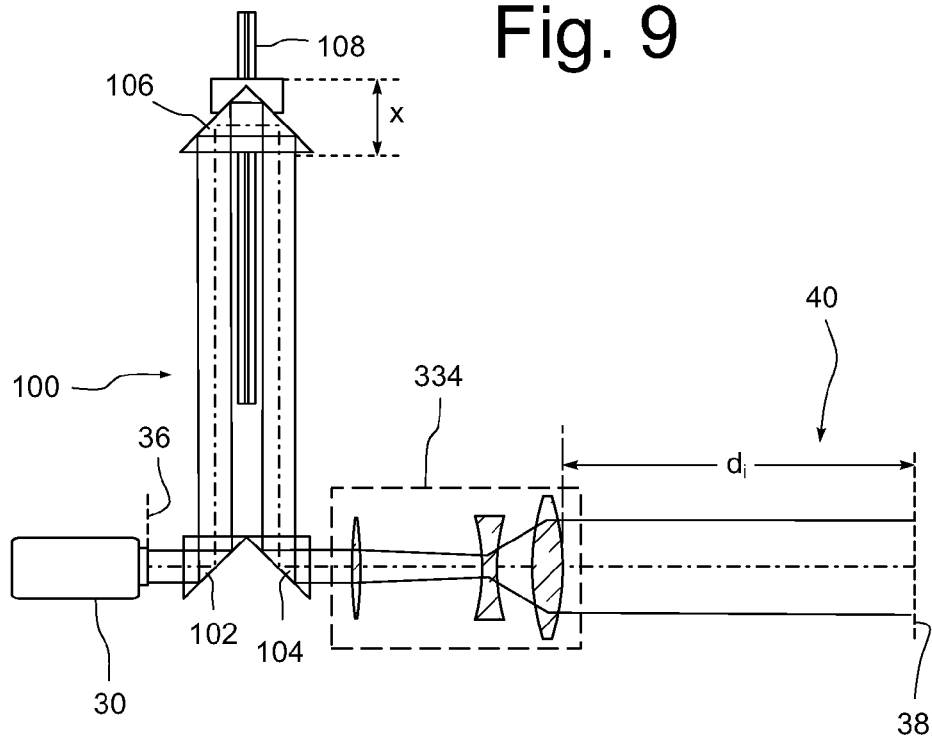
FIG. 10 shows the embodiment of FIG. 9, but with modified free object and image distances.

FIGS. 9 and 10 illustrate an embodiment in which variations of the free object distance $d_o$ are achieved with the help of a multiple beam folding system 100 which is arranged between the light source 30 and the optical imaging system 334. The multiple beam folding system 100 comprises two fixed prisms 102, 104 and a displaceable prism 106 which can be fixed at different longitudinal positions along a guide rail 108. If the position of the displaceable prism 106 is varied by a distance x (see FIG. 10), the free object distance $d_o$ as shown in FIG. 8 changes by $\Delta d_o = 2x$ and this results in a change $\Delta d_i = \beta^2 \cdot 2$ of the free image distance $d_i$, i.e. the length of the beam delivery 40. For example, if the guide rail 108 has a length of 1 m and the optical imaging system 334 has a transverse magnification of $\beta = 2$, the free image distance $d_i$ can be changed over a range of approximately 8 m.

Figure 11:
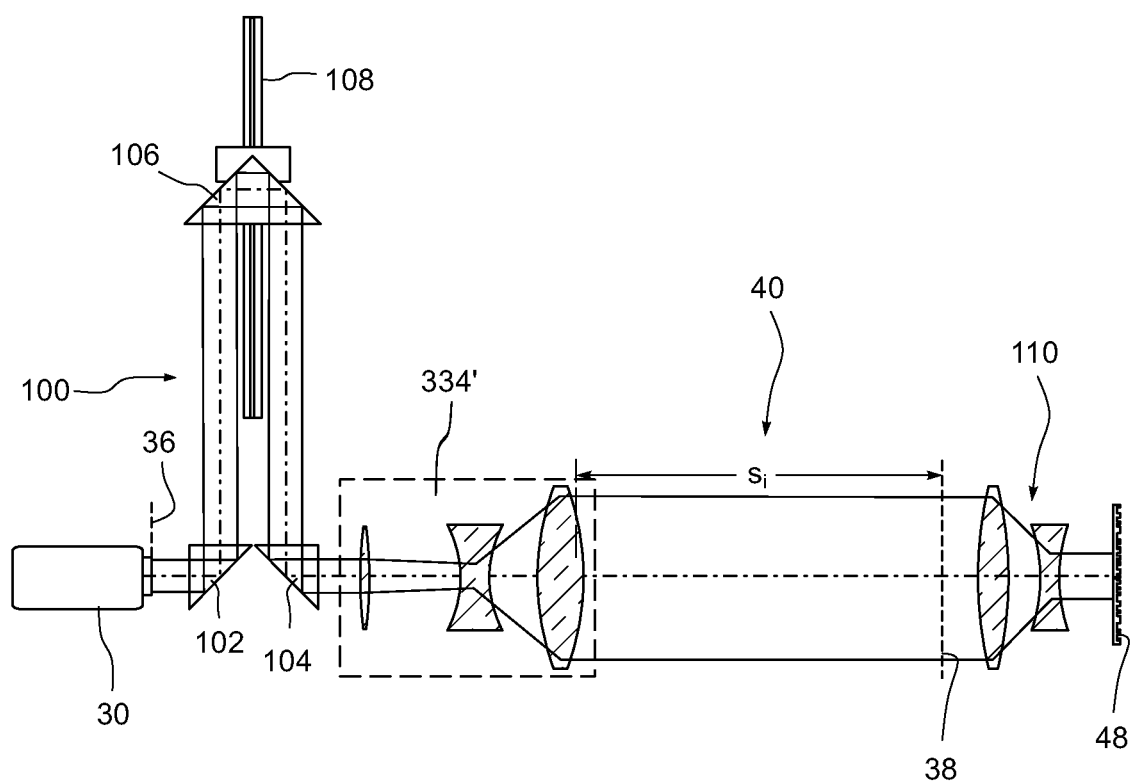
FIG. 11 is a meridional section through a still further embodiment in which the illumination system comprises a multiple beam folding system and a beam shrinking unit.

If the range of possible free image distances $d_i$ shall be greater than that, a longer guide rail 108 may be used. As an alternative, an optical imaging system 334' may be used as shown in FIG. 11 having a greater transverse magnification $\beta$, for example $\beta = 4$. Then variations of the free image distance $d_i$ up to 32 m can be achieved using a 1 m guide rail 108. However, due to the larger transverse magnification $\beta$ the field illuminated on the diffractive optical element 48 may then become too large.

For that reason the embodiment shown in FIG. 11 comprises an additional beam shrinking unit 110 which consists, in this particular embodiment, of a positive lens and a negative lens. The beam shrinking unit is arranged between the optical imaging system 334' and the diffractive optical element 48 and reduces the diameter of the substantially collimated projection light beam emerging from optical imaging system 334' to a desired value. The beam shrinking unit 110 can be arranged immediately in front of the diffractive optical element 48 so that the beam delivery 40 can be kept free of any optical elements having a reflective or refractive power.

The invention claimed is:

1. An illumination system having a pupil plane, the illumination system comprising:
   a light source configured to produce projection light during use of the illumination system;
   a diffractive optical element between the light source and the pupil plane so that, during use of the illumination system, an irradiance distribution of the projection light in the pupil plane depends on a position of a field that is illuminated by the projection light on the diffractive optical element;
   an optical imaging system between the light source and the diffractive optical element; and
   a multiple beam folding system between the light source and the optical imaging system,
   wherein the multiple beam folding system comprises an element configured to vary an optical path length within the multiple beam folding system by displacing one or more prism or planar mirror in the multiple beam folding system, and the illumination system is a microlithographic illumination system.

2. The illumination system of claim 1, wherein:
   the optical imaging system has an object plane;
   the optical imaging system has an image plane onto which the object plane is imaged during use of the illumination system;
   a light exit window of the light source is arranged in the object plane of the optical imaging system; and
   the diffractive optical element is arranged in the image plane of the optical imaging system.

3. The illumination system of claim 1, wherein the optical imaging system is telecentric on its image side.

4. The illumination system of claim 1, wherein the optical imaging system is telecentric on its object side.

5. The illumination system of claim 4, wherein the optical imaging system is telecentric on its image side.

6. The illumination system of claim 5, wherein the optical imaging system comprises at least three optical elements having a refractive or a reflective power.

7. The illumination system of claim 6, wherein the optical imaging system comprises two positive lenses and a negative lens between the two positive lenses.

8. The illumination system of claim 1, wherein the optical imaging system has a transverse magnification β with |β|>1.

9. The illumination system of claim 1, wherein the optical imaging system has a transverse magnification β with |β|>3.

10. The illumination system of claim 9, comprising a beam shrinking unit between the optical imaging system and the diffractive optical element, wherein the beam shrinking unit is configured to reduce the diameter of a collimated light beam emerging from the optical imaging system during use of the illumination system.

11. The illumination system of claim 1, wherein all optical elements of the optical imaging system are between the light source and a beam delivery of the illumination system.

12. The illumination system of claim 1, comprising a displacement mechanism configured to displace the diffractive optical element along a displacement direction which is not parallel to an optical axis of the illumination system.

13. An apparatus, comprising:
an illumination system according to claim 1; and
a projection objective,
wherein the apparatus is a microlithographic projection exposure apparatus.

14. An illumination system having a pupil plane, the system comprising
a light source configured to produce projection light during use of the illumination system;
a diffractive optical element between the light source and the pupil plane so that, during use of the illumination system, an irradiance distribution of the projection light in the pupil plane depends on a position of a field that is illuminated by the projection light on the diffractive optical element; and
an optical imaging system between the light source and the diffractive optical element,
wherein:
the illumination system is a microlithographic illumination system;
the optical imaging system has an object plane;
the optical imaging system has an image plane onto which the object plane is imaged during use of the illumination system;
a light exit window of the light source is arranged in the object plane of the optical imaging system;
the diffractive optical element is arranged in the image plane of the optical imaging system;
the optical imaging system is telecentric on its object side; and
the optical imaging system is telecentric on its image side.

15. The illumination system of claim 14, comprising a multiple beam folding system between the light source and the optical imaging system.

16. The illumination system of claim 15, wherein the multiple beam folding system comprises a plurality of prisms or planar mirrors.

17. The illumination system of claim 16, wherein at least one prism or mirror is mounted on a guide rail so that it can be fixed at different positions along the guide rail.

18. An apparatus, comprising:
an illumination system according to claim 14; and
a projection objective,
wherein the apparatus is a microlithographic projection exposure apparatus.

19. An illumination system having a pupil plane, the system comprising:
a diffractive optical element upstream of the pupil plane along a path of projection light through the illumination system so that, during use of the illumination system when projection light propagates through the illumination system, an irradiance distribution of the projection light in the pupil plane depends on a position of a field that is illuminated by the projection light on the diffractive optical element; and
an optical imaging system upstream of the diffractive optical element along the path of the projection light through the illumination system,
wherein the diffractive optical element is in an image plane of the optical imaging system and a beam delivery of the illumination system is between the optical imaging system and the diffractive optical element, the illumination system is a microlithographic illumination system.

20. An apparatus, comprising:
an illumination system according to claim 19; and
a projection objective,
wherein the apparatus is a microlithographic projection exposure apparatus.

21. The illumination system according to claim 19, wherein the beam delivery of the illumination system comprises a planar folding mirror.

* * * * *

UNITED STATES PATENT AND TRADEMARK OFFICE
CERTIFICATE OF CORRECTION

PATENT NO. : 9,280,055 B2
APPLICATION NO. : 13/952179
DATED : March 8, 2016
INVENTOR(S) : Michael Patra and Markus Deguenther It is certified that error appears in the above-identified patent and that said Letters Patent is hereby corrected as shown below:

Specification

Col. 1, under "ILLUMINATION SYSTEM OF A MICROLITHOGRAPHIC PROJECTION EXPOSURE APPARATUS", insert -- Cross-Reference to Related Applications The present application is a continuation of, and claims benefit under 35 USC 120 to, international application PCT/EP2011/000960, filed February 28, 2011. The entire disclosure of international application PCT/EP2011/000960 is incorporated by reference herein. --.

Col. 5, line 10, delete "With" and insert -- with --.

Signed and Sealed this
Nineteenth Day of July, 2016

Michelle K. Lee
*Director of the United States Patent and Trademark Office*